US008772909B1

(12) United States Patent
Vinciarelli

(10) Patent No.: US 8,772,909 B1
(45) Date of Patent: Jul. 8, 2014

(54) ISOLATOR WITH INTEGRAL TRANSFORMER

(71) Applicant: Patrizio Vinciarelli, Boston, MA (US)

(72) Inventor: Patrizio Vinciarelli, Boston, MA (US)

(73) Assignee: VLT, Inc., Sunnyvale, CA (US)

( * ) Notice: Subject to any disclaimer, the term of this patent is extended or adjusted under 35 U.S.C. 154(b) by 0 days.

(21) Appl. No.: 13/645,133

(22) Filed: Oct. 4, 2012

(51) Int. Cl.
  *H01L 23/12* (2006.01)
  *H04B 3/56* (2006.01)

(52) U.S. Cl.
  USPC .......................................... 257/531; 257/700

(58) Field of Classification Search
  USPC ................................................. 257/531, 700
  See application file for complete search history.

(56) References Cited

U.S. PATENT DOCUMENTS

| | | | |
|---|---|---|---|
| 6,262,600 B1 | 7/2001 | Haigh et al. | 326/82 |
| 6,501,364 B1 | 12/2002 | Hui et al. | 336/200 |
| 6,940,013 B2 | 9/2005 | Vinciarelli et al. | 174/52.1 |
| 7,468,547 B2 | 12/2008 | Harvey | 257/666 |
| 7,701,731 B2 | 4/2010 | Dhuyvetter et al. | 363/16 |
| 8,592,944 B2 * | 11/2013 | Santangelo et al. | 257/531 |
| 2003/0095026 A1 | 5/2003 | Kawanobe | 336/200 |
| 2011/0050292 A1 | 3/2011 | Hui et al. | 327/109 |

OTHER PUBLICATIONS

Hui et al., "Optimal Operation of Coreless PCB Transformer-Isolated Gate Drive Circuits with Wide Switching Frequency Range," IEEE Transactions on Power Electronics, vol. 14, No. 3, 506-514, May 1999.

Analog Devices, "High Speed, ESD-Protected, Full-Duplex, *i*Coupler Isolated RS-485 Transceiver", 16 pages, 2006-2008.
Analog Devices, "ADM2490E: 5 kV Signal Isolated, High Speed (16 Mbps), ESD Protected, Full Duplex RS-485 Transceiver", 2 pages, downloaded Sep. 30, 2011.
Analog Devices, "Coupler® Digital Isolation—Unparalleled Performance and Integration", downloaded Aug. 31, 2011.
Avago Technologies, "Parametric Search: digital Isolator", 2 pages, 2005-2011.
Avago Technologies, "ACML-7400, ACML-7410 and ACML-7420 3.3V/5V 100 MBd High Speed CMOS Digital Isolator", 13 pages, May 16, 2011.
Business Wire, "Analog Devices Introduces First Digital Isolator Packaging that Meets Safety Requirements in Medical and Industrial Applications", www.businesswire.com/news/home/20111005005026/en/anaglog-Devices-Introduc . . . , 3 pages, Oct. 12, 2011.
Hui et al., "Some Electromagnetic Aspects of Coreless PCB Transformers", IEEE Transactions on Power Electronics, vol. 15, No. 4, pp. 805-810, Jul. 2000.

(Continued)

*Primary Examiner* — Evan Pert
(74) *Attorney, Agent, or Firm* — Fish & Richardson P.C.

(57) ABSTRACT

A signal isolator comprises a multilayer substrate with conductive layers separated by insulation. A region within the substrate is defined by upper and lower conductive shields. A transformer, including primary and secondary windings, is formed in the region. Circuitry supported on an upper conductive layer includes a high frequency oscillator for receiving an input signal, the high frequency oscillator being connected to excite the primary winding in response to the signal. A detector circuit coupled to the secondary winding is adapted to provide an output signal in response to the high frequency oscillator excitation of the primary winding. The circuitry may be powered exclusively by power received from the input signal. The oscillator may modulate the primary excitation and the detector may vary the magnitude of the output in response to the modulation. A plurality of isolator channels may be provided on a single multilayer substrate.

38 Claims, 16 Drawing Sheets

(56) References Cited

OTHER PUBLICATIONS

Isolator vs. Optocoupler Technology, Silicon Labs, downloaded Feb. 22, 2013, 21 pages, www.silabs.com/products/power/isolators.
Lee et al., "Multilayer Stacked Coreless Printed Spiral Winding Inductor With Wide Frequency Bandwidth", IEEE Energy Conversion Congress and Exposition, pp. 1002-1009, 2009.
Minteer, Design of a New Transformer-Isolated Analog Acquisition System, IEEE Transactions on Power Delivery vol. 24, No. 3, pp. 1054-1062, Jul. 2009.
Mohan et al., "Power Electronics-Converters, Applications and Design", $2^{nd}$ Edition, John Wiley and Sons, pp. 708-709, 1995.
NVE Corporation, IL600 Series, 21 pages, Sep. 2010.
NVE Corporation, "Isolator Product Application", 3 pages downloaded Sep. 30, 2011.
Silicon Labs, "Discrete ISOvolt-EVB", 14 pages, Rev. 02 Sep. 2011.
Silicon Labs, "Si84xx Digital Isolators", downloaded Sep. 30, 2011.
Silicon Labs, "SI8410/20/21", 30 pages, Mar. 2011.
Tang et al., "Evaluation of the Shielding Effects on Printed-Circuit-Board Transformers Using Ferrite Plates and Copper Sheets", IEEE Transactions on Power Technology, vol. 17, No. 6, pp. 1080-1088, Nov. 2002.
Texas Instruments, "Application Report ISO72x Digital Isolator Magnetic-Field Immunity", 6 pages Jan. 2006—Revised Feb. 2006.

\* cited by examiner

ISOLATOR WITH INTEGRAL TRANSFORMER

TECHNICAL FIELD

This invention relates to apparatus and methods for delivering electrical signals across a magnetically coupled galvanic isolation barrier.

BACKGROUND

Signal isolators, or isolators, as those terms are used herein, are devices that accept an electrical signal via an isolator input port and provide a replica of that signal at an isolator output port, while providing galvanic isolation between the input and output ports. Signal isolators may be used for safety, e.g., to isolate selected portions of a circuit from high voltages in another part of a circuit, and they may be used to minimize or prevent disturbances in one portion of a circuit that might otherwise be caused by normal-mode or common-mode signals in another part of a circuit.

Digital isolators are signal isolators that are optimized for use in transferring digital signals across an isolation barrier. Maintaining digital signal integrity may require that a digital isolator exhibit wide bandwidth to enable transfer of high frequency digital signals with fast rise and fall times, and may also require small input-to-output propagation delay times so that the relative timing of signal transitions on the output side of the isolator closely conforms to the timing of the transitions at the input. Analog isolators are signal isolators that have the ability to transfer analog signals across an isolation boundary. Maintaining analog signal integrity may additionally require that an analog isolator exhibit linearity over a wide bandwidth so that the relative amplitude of the signal on the output side of the isolator closely conforms to the relative amplitude of the signal at the input.

Some isolators use an isolation transformer, e.g. a pair of magnetically coupled insulated windings, to provide the galvanic isolation between the input and output ports. The transformer may be coreless. Analog Devices, Norwood, Mass., USA, for example offers an iCoupler™ product family of digital isolators using chip-scale transformer windings isolated by means of thick polyimide insulation and CMOS integrated circuits that are packaged with, but separate from, the chip-scale transformer, to provide input and output interfaces. Operation of iCoupler products requires user provided primary-side and secondary-side bias-supplies for powering the input and output interface circuitry within the isolator.

Use of a combination of magnetic and copper shields is described in Tang et al, *Evaluation of the Shielding Effects on Printed-Circuit-Board Transformers Using Ferrite Plates and Copper Sheets*, IEEE Transactions on Power Technology, Vol. 17, No. 6, November 2002, pp. 1080-1088. A multilayer coreless inductor with copper shields is described in Lee et al, *Multilayer Stacked Coreless Printed Spiral Winding Inductor with Wide Frequency Bandwidth*, IEEE Energy Conversion Congress and Exposition, 2009, pp. 1002-1009. A transformer having multiple winding layers is described in Kawanobe, *Transformer*, U.S. Patent Application Publication No. US 2003/0095026 A1.

Transfer of digital data across a magnetically isolated barrier using a modulated high frequency carrier is described in Mohan et al, *Power Electronics—Converters, Applications and Design*, $2^{nd}$ Edition, John Wiley and Sons, 1995, pp. 708-709; Haigh et al, *Isolator for Transmitting Logic Signals Across an Isolation Barrier*, U.S. Pat. No. 6,262,600; and Hui et al, *Optimal Operation of Coreless PCB Gate Drive Circuits*, IEEE Transactions on Power Technology, Vol. 14, No. 3, May 1999. Output circuitry powered by energy transferred across the transformer is disclosed in Mohan, supra, and Hui, supra.

SUMMARY

In one aspect, in general, an apparatus may include a substrate for supporting circuitry and having a plurality of parallel conductive layers separated by insulation. A region may be formed in the substrate having an upper conductive shield formed in a second conductive layer of the substrate and a lower conductive shield formed in a fifth conductive layer of the substrate. A transformer may be formed in the region between the upper conductive shield and lower conductive shield. The transformer may include a primary winding formed in a third conductive layer of the substrate and a secondary winding formed in a fourth conductive layer of the substrate. The region may provide space for a magnetic field coupling the windings. A first high frequency oscillator circuit may have an input for receiving an input signal and be connected to excite the primary winding at a first frequency in response to the input signal. A first detector circuit may be coupled to the secondary winding and may have a first output. The first detector circuit may be adapted to selectively sense the first frequency and be configured to provide an output signal via the first output in response to the first oscillator exciting the primary winding. Encapsulation material may cover the electronic components and at least a portion of the upper surface of the substrate.

Implementations of the apparatus may include one or more of the following features. The oscillator circuit may be powered exclusively by power received from the input signal. The detector circuit may be powered exclusively by power received through the transformer. The oscillator circuit may be adapted to amplitude modulate the excitation of the primary winding as a function of the input signal. The first detector circuit may be adapted to provide an analog output signal having an amplitude that is a function of the amplitude of the excitation. The first detector may include an open-collector output. The first detector circuit may sink a current as the output signal. The first detector circuit may be adapted to provide a binary output signal having a state that is a function of the presence or absence of the excitation. The region may occupy an area in the substrate that is below electronic components on the upper surface of the substrate. The region may be free of magnetically permeable material. The substrate may include the following conductive layers separated by insulation: (1) a first conductive layer on an upper surface of the substrate for forming connections between electronic components on the surface of the substrate; (2) the second conductive layer being below the first conductive layer; (3) the third conductive layer being below the second conductive layer; (4) the fourth conductive layer being below the third conductive layer; (5) the fifth conductive layer being below the fourth conductive layer. The substrate may further include (6) a sixth conductive layer on a bottom surface of the substrate, separated from the fifth conductive layer by insulation, for forming connections between the substrate and an external circuit. The first frequency of the oscillator circuit may be tightly controlled. The oscillator circuit may include a resonant tank including the transformer. The oscillator circuit may include a digital oscillator and frequency multiplier. The transformer may be loosely coupled. The transformer may be characterized by a coupling coefficient between the windings that is less than 60% or less that 35%.

A second region may be formed in the substrate and a second transformer may be formed in the second region. The second transformer may include a second primary winding formed in a selected conductive layer of the substrate and a second secondary winding formed in another selected conductive layer of the substrate. A second high frequency oscillator circuit may have a second input for receiving a second input signal. The second oscillator circuit may be connected to excite the second primary winding at a second frequency in response to the second input signal. The second frequency and the first frequency may be separated by a predetermined difference in frequency. A second detector circuit may be coupled to the second secondary winding and may have a second output. The second detector may be adapted to selectively sense the second frequency and provide a second output signal via the second output in response to the second oscillator exciting the second primary winding.

In one aspect, in general, a method of providing galvanic isolation for one or more signals may include providing a substrate for supporting isolator circuitry and having a plurality of parallel conductive layers separated by insulation. A region may be provided in the substrate between an upper conductive shield formed in a second conductive layer of the substrate and a lower conductive shield formed in a fifth conductive layer of the substrate. A first transformer may be formed in the region between the upper conductive shield and lower conductive shield. A first primary winding may be formed in a third conductive layer of the substrate and a first secondary winding may be formed in a fourth conductive layer of the substrate. Space may be provided in the region for a magnetic field coupling the first primary and secondary windings. The primary winding may be excited at a first frequency using power derived exclusively from a first input signal. The first frequency may be selectively at the secondary winding and an output signal may be provided via a first output in response to sensing the first frequency and using power derived from the secondary winding. The electronic components and at least a portion of the upper surface of the substrate may be covered with encapsulation material.

DESCRIPTION OF DRAWINGS

Like reference symbols in the various drawings indicate like elements.

DETAILED DESCRIPTION

Isolator Functional Overview

Figure 9:
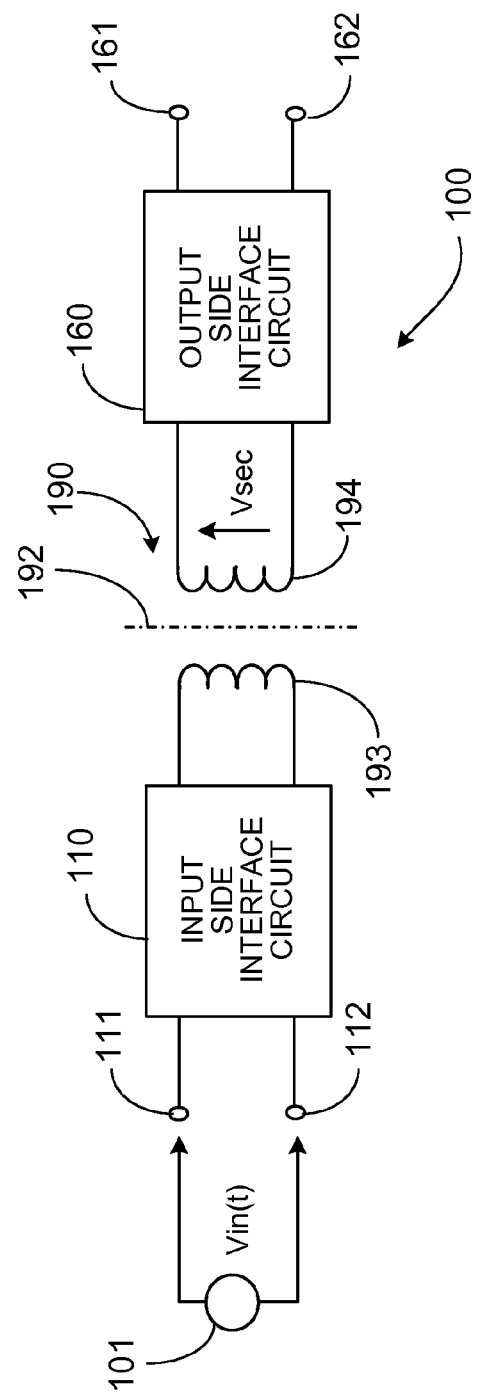
FIG. 9 is a block diagram of a single isolator channel.
Figure 10:
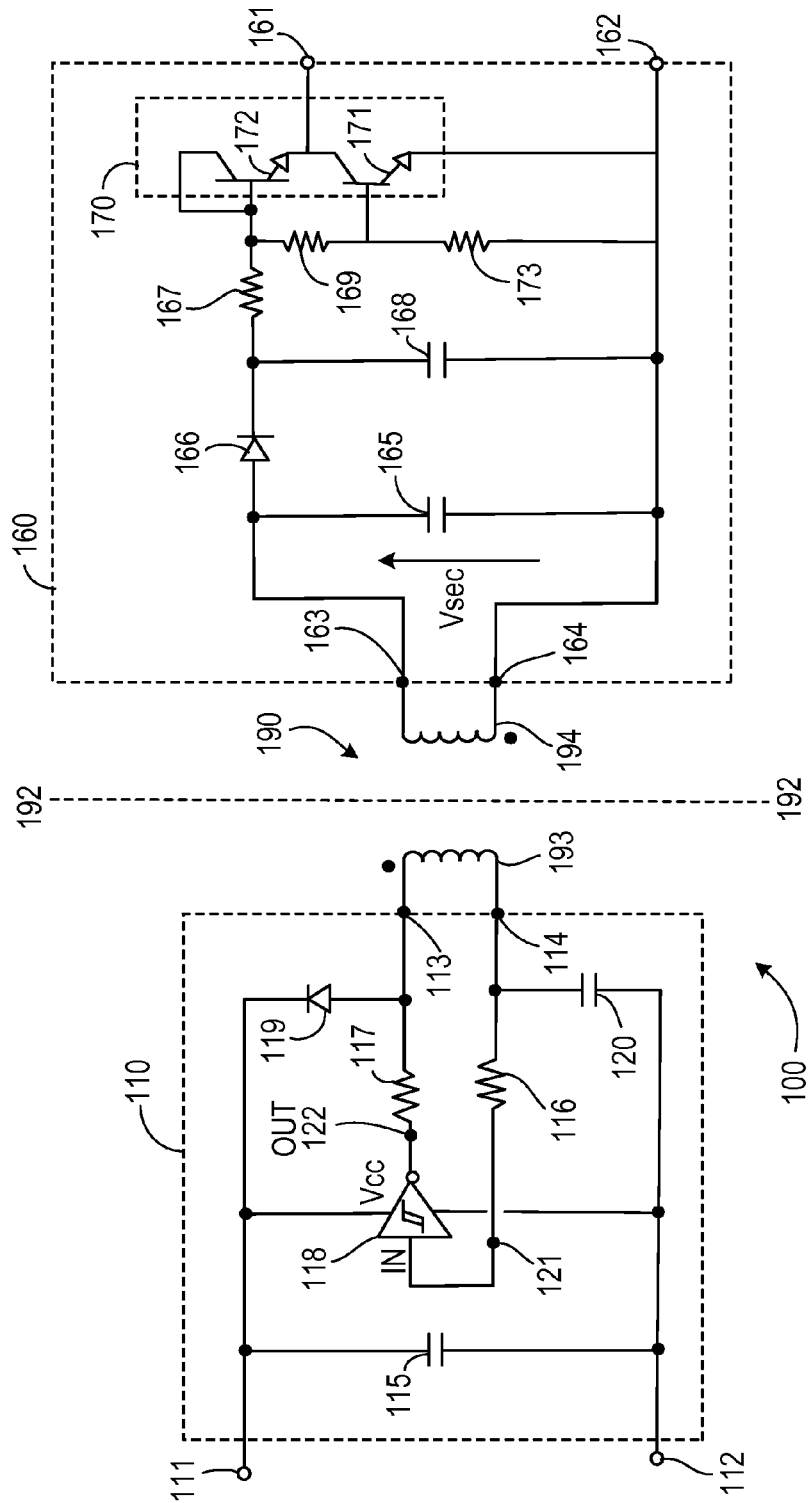
FIG. 10 is a schematic diagram of a single isolator channel.

Referring to FIG. 9, an electrical block diagram of a single channel isolator 100 is shown including an isolation boundary 192 bridged by a transformer 190 having a primary winding 193 on one side and a secondary winding 194 on the other side of the isolation boundary 192. The isolator 100 includes input-side interface circuitry 110 for receiving an input signal 101 and driving the primary winding 193, and output-side interface circuitry 160 for receiving a signal, e.g. Vsec, from the secondary winding 194 and delivering an output signal representative of the input signal to circuitry external to the isolator (not shown) via terminals 161, 162. One implementation of the single channel isolator is shown in the schematic of FIG. 10. The transformer 190 provides a medium for communication across the isolation boundary while preserving galvanic isolation between the input signal 101 and the output signal. Each transformer winding, as well as its respective interface circuitry, is electrically isolated from its counterpart on the opposite side of the isolation boundary 192 as shown in FIG. 9. Power for operating the input-side circuitry 110 may be derived from the input signal 101 and power for operating the output-side circuitry 160 may be derived from the signal delivered by the secondary winding as shown in the block diagram of FIG. 9 by the absence of separate power connections to the isolator 100.

Isolator Assembly

Figure 1:
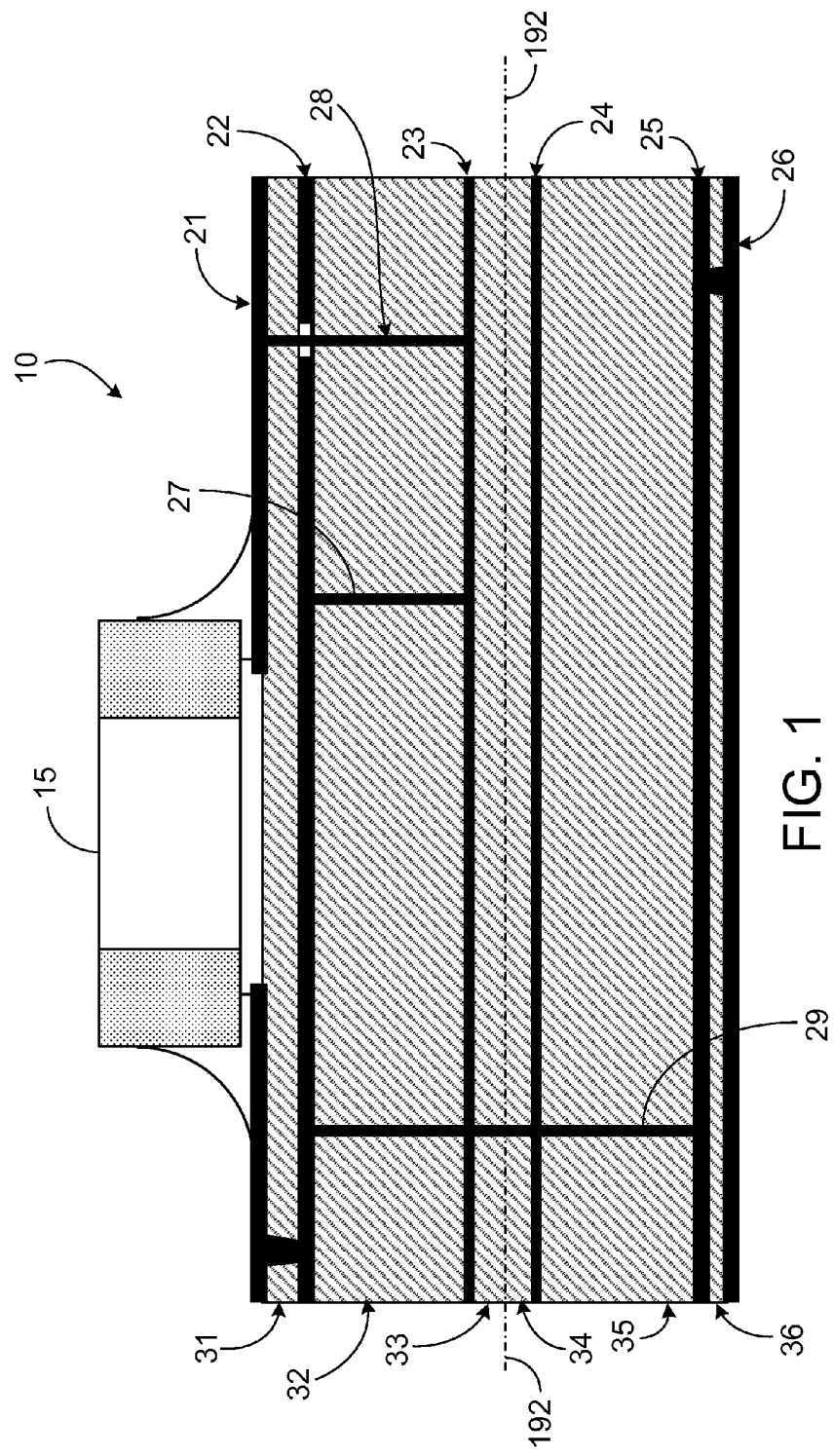
FIG. 1 is a cross-section showing construction details of a multilayer isolator.
Figure 2:
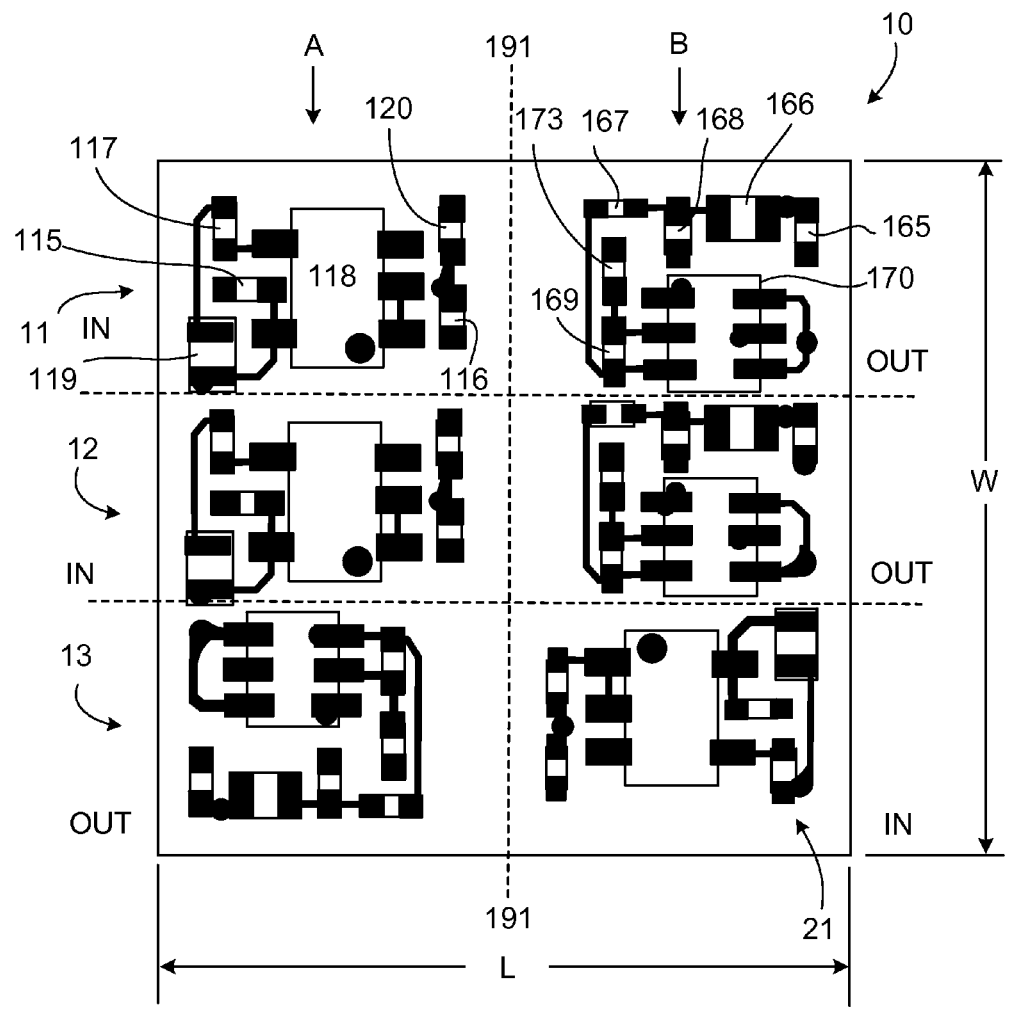
FIG. 2 is a top plan view showing a top conductive layer of a multichannel isolator.
Figure 6:
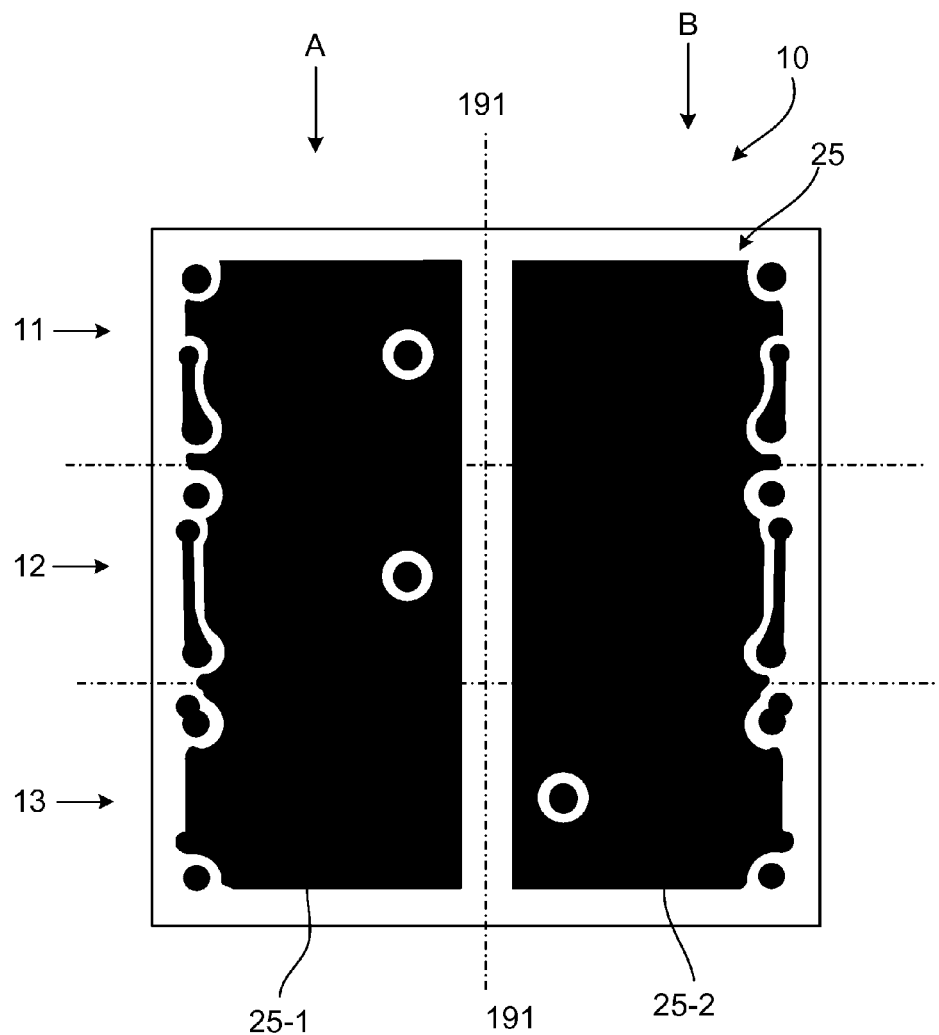
FIG. 6 is a plan view showing a lower inner conductive shield layer of a multichannel isolator.
Figure 7:
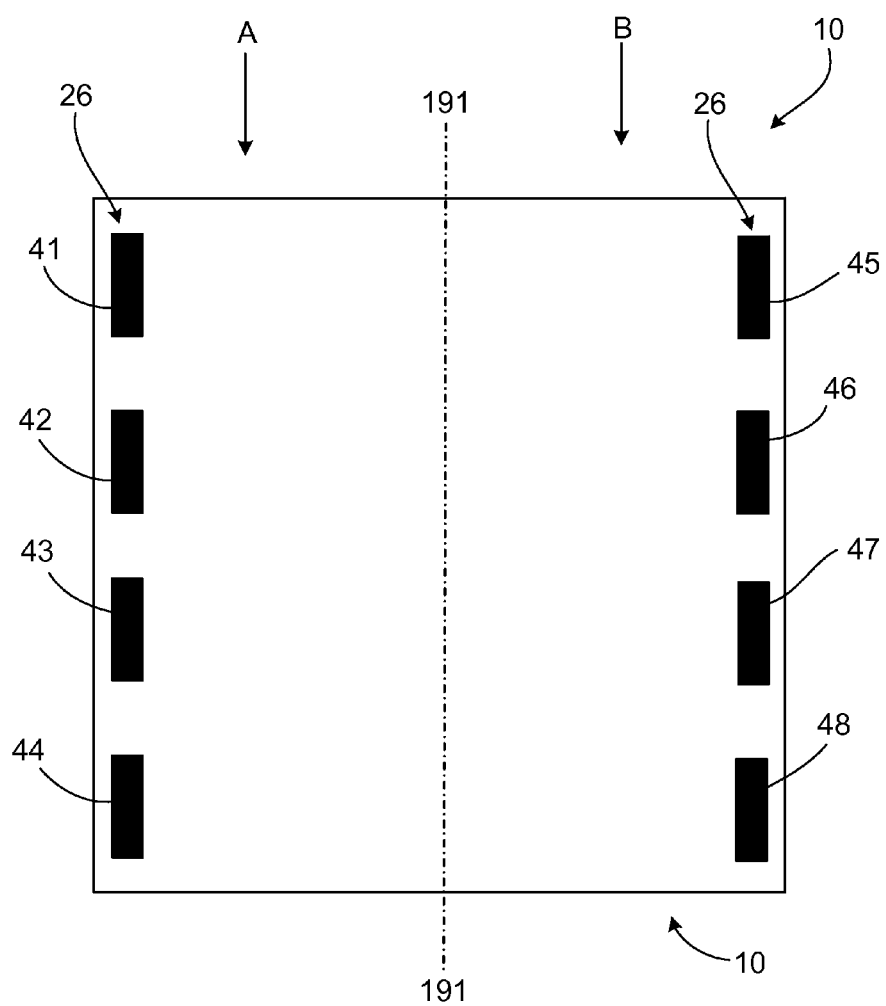
FIG. 7 is a plan view showing a bottom conductive layer of a multichannel isolator.
Figure 8:
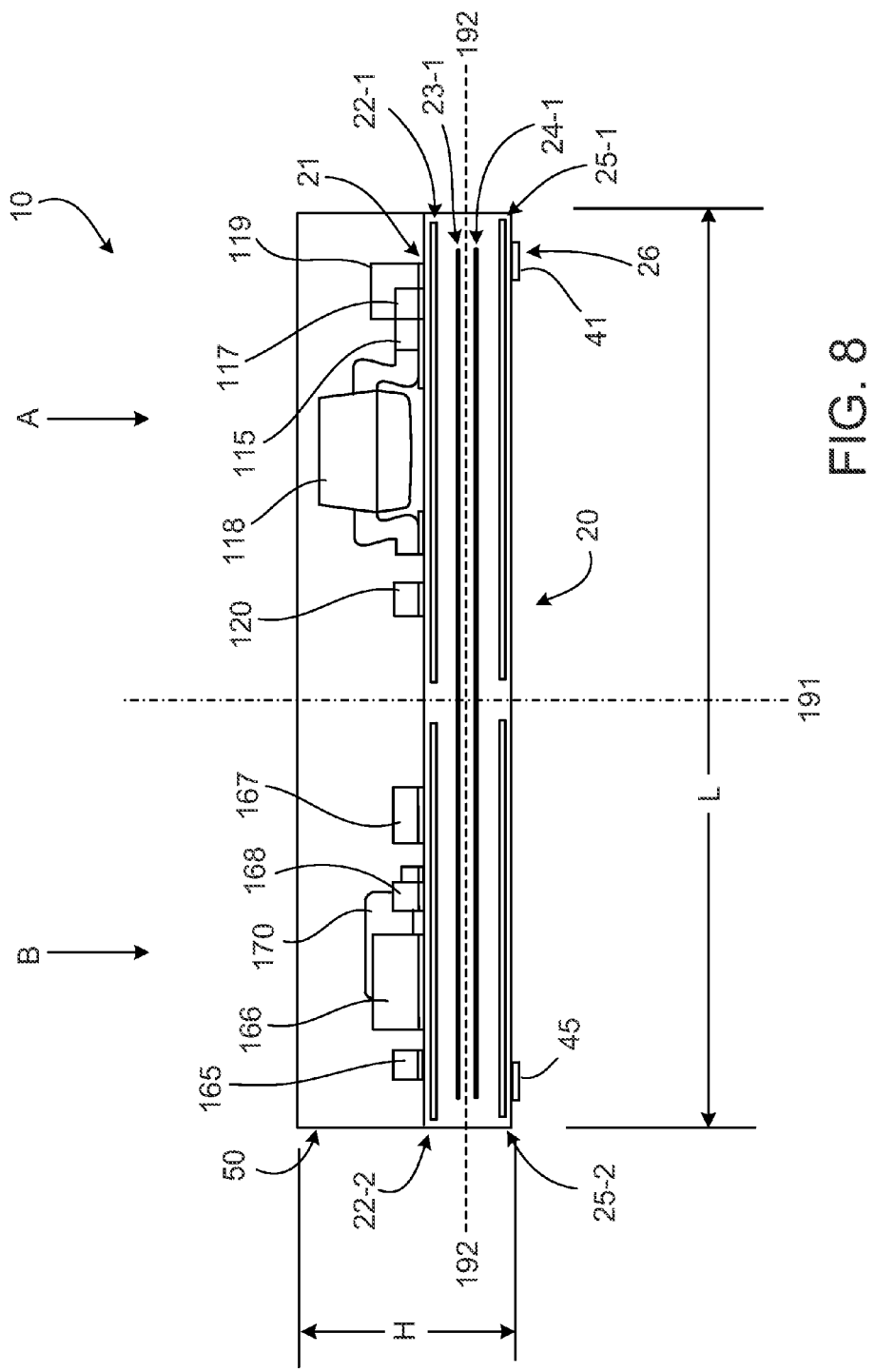
FIG. 8 is a side view showing a section of a multichannel isolator.

Referring generally to FIGS. 1 through 8, the construction of an isolator 10 incorporating three independent single channel isolators, such as single channel isolator 100 shown in the block diagram of FIG. 9 and in the schematic diagram of FIG. 10, may be formed as shown in FIG. 8 on a multilayer substrate 20 and encapsulated as a system in a package. Each isolator channel 11, 12, 13, has an input which receives an input signal and an output that delivers an output signal that is isolated from and representative of its input. As shown in FIG. 2, signal flow through the first isolator 11 and the second isolator 12 is from left to right, whereas the signal flow through the third isolator 13 is from right to left. Thus, the illustrated arrangement of the three isolators allows for isolated transmission of two digital signals in one direction and isolated transmission of a third digital signal in the opposite direction. The substrate 20, in addition to providing electrical interconnections, mounting support for the electronic components, and terminations for connection to external circuitry, may include an integral shielded transformer formed in the inner layers of the substrate. The cross-sectional views of FIGS. 1 and 8 show an arrangement of the plurality of alternating conductive and insulating layers of the isolator substrate 20. Top plan views of each of six conductive layers, 21 through 26, are provided in FIGS. 2 through 7, respectively which also include component placement details and connections on the top and bottom conductive layers. The isolator 10 may be constructed as shown on a substrate that is 10 mm (0.394 in) long, L, and 10 mm (0.394 in) wide, W as shown in FIG. 2 and have an overall height of 2.4 mm (0.095 in) as shown in FIG. 8.

Substrate Structure

Figure 4:
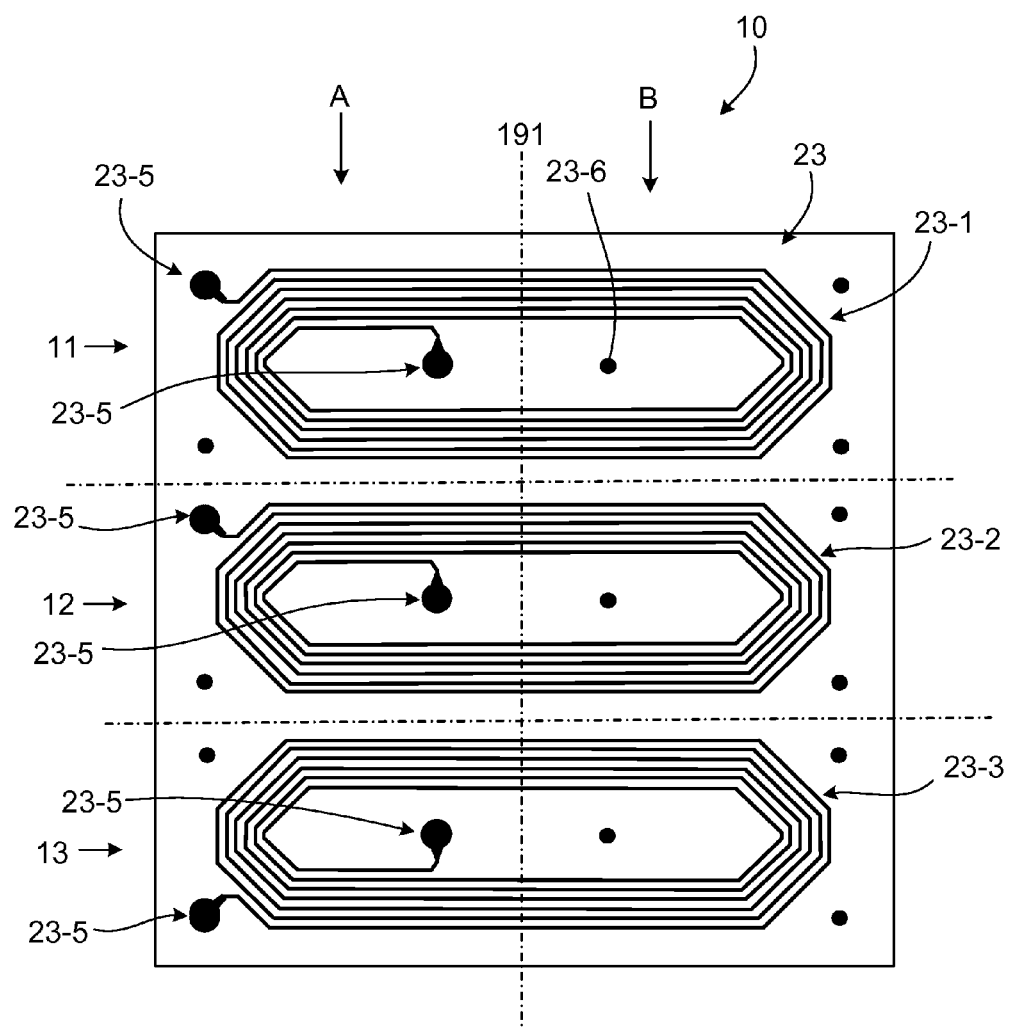
FIG. 4 is a plan view showing an upper inner conductive winding layer of a multichannel isolator.
Figure 5:
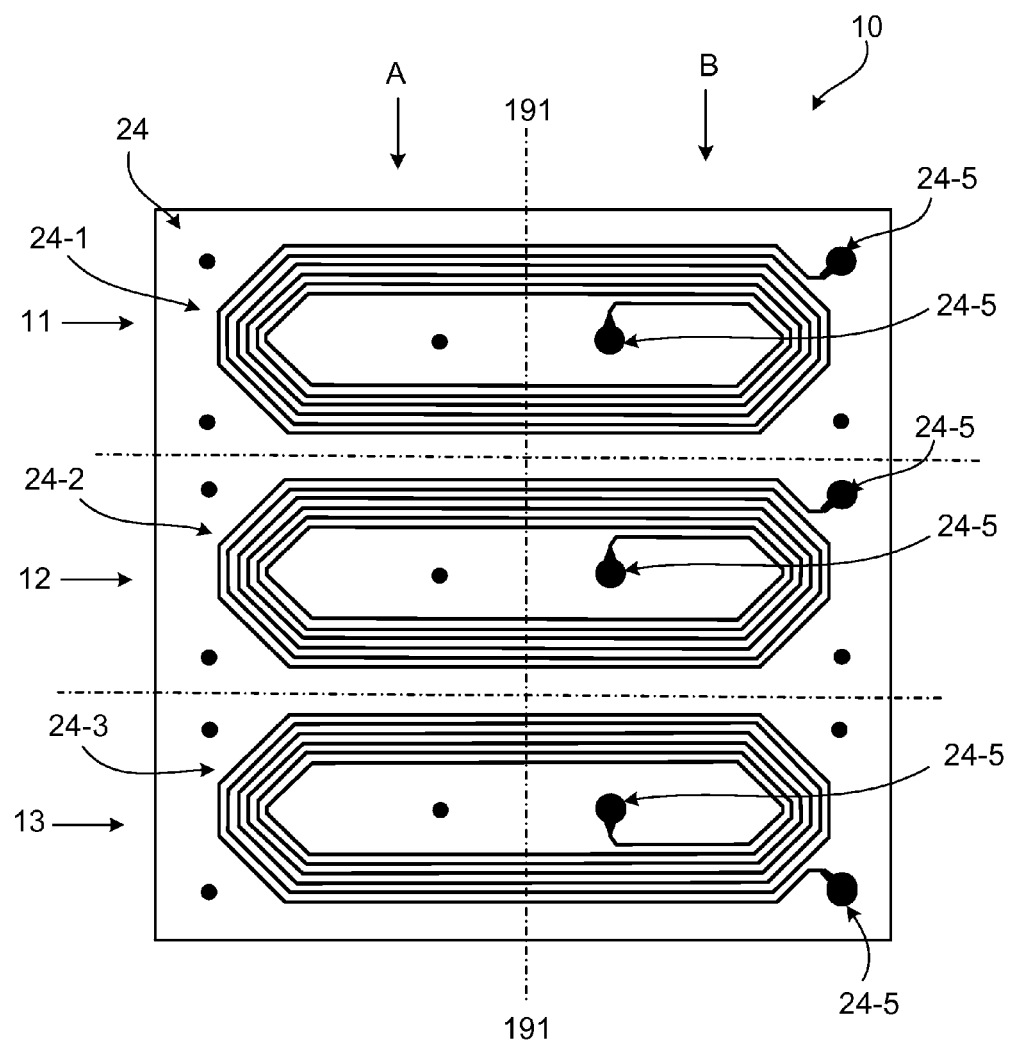
FIG. 5 is a plan view showing a lower inner conductive winding layer of a multichannel isolator.

The isolator assembly 10 includes a multilayer substrate 20, such as a printed circuit board ("PCB"), which as shown in the cross-sectional view of FIG. 1 (and in FIG. 8) may include six conductive layers 21, 22, 23, 24, 25, and 26, separated by at least one intervening insulation layer. Starting from the component-side of the substrate 20 (the top in the cross-section of FIG. 1), the first (top) conductive layer 21 may be used to form circuit interconnections and pads onto which the electrical components (such as component 15 in FIG. 1) may be placed as shown in the plan view of FIG. 2 preferably using surface mount solder techniques. A second inner conductive layer 22 (FIG. 3) may be used to form an upper shield over the transformer windings which may be formed in the third and fourth inner conductive layers 23, 24 (FIGS. 4, 5). The fifth inner conductive layer 25 may be used to form a lower shield (FIG. 6) beneath the transformer windings (conductive layers 23, 24). A sixth (bottom) conductive layer 112 may be used to form interconnection terminals 41-48 as shown in the plan view of FIG. 7.

The substrate 20 may include insulating layers between the conductive layers as shown in FIG. 1: a first insulating layer 31 located between the top conductive layer 21 and the second inner conductive layer 22; a second insulating layer 32 located between the second inner conductive layer 22 and the third inner conductive layer 23; a third insulating layer 33 and an optional fourth insulating layer 34 as shown, arranged one on top of the other and located between the third inner conductive layer 23 and the fourth inner conductive layer 24; a fifth insulating layer 35 located between the fourth inner conductive layer 24 and the fifth inner conductive layer 25; and a sixth insulating layer 36 located between the fifth inner conductive layer 25 and the sixth bottom conductive layer 26.

Conductive paths or vias may pass vertically through one or more insulating layers of the substrate to create a connection, or connections, between two or more conductive layers as is well known in the multilayer printed circuit board art. For example, conductive via 27 is shown connecting a portion of conductive layer 22 to a portion of conductive layer 23; conductive via 28 is shown connecting a portion of layer 21 to a portion of layer 23 passing through conductive layer 22 without making a connection to it; via 29 is shown connecting a portion of layer 22 to portions of layers 23, 24 and 25.

Note that the multilayer stack-up shown in the cross-sectional view of FIG. 1 is illustrative of the general arrangement of the layers and the mechanisms for making connections but does not show details of how the conductive layers are patterned, does not reflect the specific circuit connections as shown for example in the conductive layer plan views or the schematic diagrams, and is not drawn to scale. In one embodiment, the substrate 20 may be a multilayer printed circuit board ("PCB") comprising in nominal dimensions: a 0.0018" thick copper first top layer; a 0.002" thick copper second inner layer; a 0.0007" thick copper third inner layer; a 0.0007" thick copper fourth inner layer; a 0.002" thick copper fifth inner layer; a 0.0018" thick copper sixth bottom layer; a first insulating layer comprising 0.004" thick pre-preg material; a second insulating layer comprising 0.021" thick fiberglass core material; the third and fourth insulating layers comprising a 2-ply pre-preg material having a total thickness of 0.010"; a fifth insulating layer comprising 0.021" thick fiberglass core material; and a sixth insulating layer comprising 0.004" thick pre-preg material.

Isolation Boundaries

In the top plan view of FIG. 2, the isolator 10 is shown divided into three isolator channels, first channel 11, second channel 12, and third channel 13. Applications requiring isolators typically require separation and isolation between the two sides of the isolator and the external circuitry to which it may be connected by specified minimum distances and breakdown voltage ratings. The isolator 10 is accordingly divided along an isolation boundary 191 shown in FIG. 2 separating each of the three channels into an A-side and a B-side. For clarity, two reference designations 191 and 192 are used for different physical and structural aspects of the isolation boundary 192 shown schematically in FIG. 9. The isolation boundary 191 shown in FIGS. 2 through 8 represents lateral separation of the A-side and B-side components and conductors by a predetermined distance and includes the physical structure of the insulation layers of the substrate and the encapsulant in the system in a package as shown in FIG. 8. The isolation boundary 192 of FIGS. 1 and 8 (transformer isolation 192 in FIGS. 9 and 10) represents a vertical separation between the planes of conductive layers 23 and 24 (used for the transformer windings) and includes the physical structure of insulation layers 33 and 34. Isolation breakdown voltages greater than 5,000 Volts have been achieved in the illustrated example. The combination of these features will be discussed in greater detail in connection with the transformer and shield structures below.

Transformer Winding Structure

Each isolator channel (11, 12, 13) of isolator 10 includes a respective independent transformer (190 FIG. 9) which may be formed in the substrate 20. Each transformer includes two windings, one primary winding 193 (FIG. 9) on the input side and one secondary winding 194 (FIG. 9) on the output side of the isolation boundary 191. The isolator example shown in FIG. 2 is arranged with two isolator channel (11, 12) inputs and one isolator channel (13) output on the A-side (left) of the isolation boundary 191, providing communication from the A-side to the B-side in two channels (11, 12) and in the reverse direction from the B-side to the A-side in one channel (13). The windings of each transformer may preferably be formed in adjacent inner conductive layers, e.g. as shown in the side view of isolator 10 in the region of channel 11 provided in FIG. 8.

To promote magnetic coupling between the windings, the primary and secondary windings of each transformer preferably may be positioned in an overlying arrangement while being separated from each other by one or more insulation layers providing a galvanic isolation barrier 192 (FIGS. 1, 8). In the example of FIGS. 1-8, the innermost conductive layers, 23 and 24, have been dedicated for the transformer windings. These two conductive layers are separated by the isolation boundary 192 which as shown in FIGS. 1, 8 includes insulation layers 33 and 34. Accordingly, all A-side transformer windings are shown formed in layer 23 (FIG. 4) and all B-side windings are shown formed in layer 24 (FIG. 5). The isolation boundary 192 in FIGS. 1, 8 between the transformer windings preferably includes two insulation layers to reduce the likelihood that defects in the insulating layers would provide a shorting path between the windings. Accordingly, with the arrangement shown in FIG. 2 (channel 11 input, channel 12 input, and channel 13 output on the A-side), the primary windings (193, FIG. 9) of channels 11 and 12 and the secondary winding (194, FIG. 9) of channel 13 are shown formed in conductive layer 23 (A-side) in FIG. 4. Similarly the matching windings (secondary windings of channels 11 and 12 and the primary winding of channel 13) are shown formed in conductive layer 24 (B-side) in FIG. 5. Preferably, the terminations of the windings formed in layer 23 are provided on the A-side and the terminations of the windings formed in layer 24 are provided on the B-side of the substrate 20. FIG. 4 shows the three A-side windings 23-1, 23-2, 23-3 formed in conductive layer 23 with terminations 23-5 located on the A-side of the isolation boundary 191. Similarly, FIG. 5 shows the three B-side windings 24-1, 24-2, 24-3 formed in conductive layer 24 with terminations 24-5 located on the B-side of the isolation boundary 191. The winding terminations may be aligned to form connections with the other circuitry or terminals using conductive vias (e.g. vias 27 and 28; FIG. 1). The transformers may be constructed as shown without magnetically permeable cores.

Transformer Shield Structure

Interference in the core-less transformer structure may be reduced by providing one or more shields for the windings. In the example of isolator 10, two conductive shield layers are shown: a top shield layer 22 (FIG. 3) positioned above the transformer windings (the next conductive layer above the A-side windings) and a bottom shield layer 25 (FIG. 6) positioned below the transformer windings (the next conductive layer below the B-side windings). Note that the insulation layers between the shields and the windings are somewhat thicker providing space for the magnetic fields around the transformer windings.

The shield layers 22, 25, separated as shown in FIGS. 1 and 8 from the windings by insulating layers 32, 35, define a region in the substrate 20 within which the transformer windings may be situated and may act as eddy current shields to attenuate magnetic fields that impinge in a direction perpendicular to the shields. The shields therefore serve not only to contain magnetic fields associated with the windings within the region and reduce the magnitude of those fields outside of the region (e.g., external to the isolator 10), but also to similarly reduce the susceptibility of the windings (and thus the isolator circuitry) to the effects of fields generated externally to the isolator.

Figure 3:
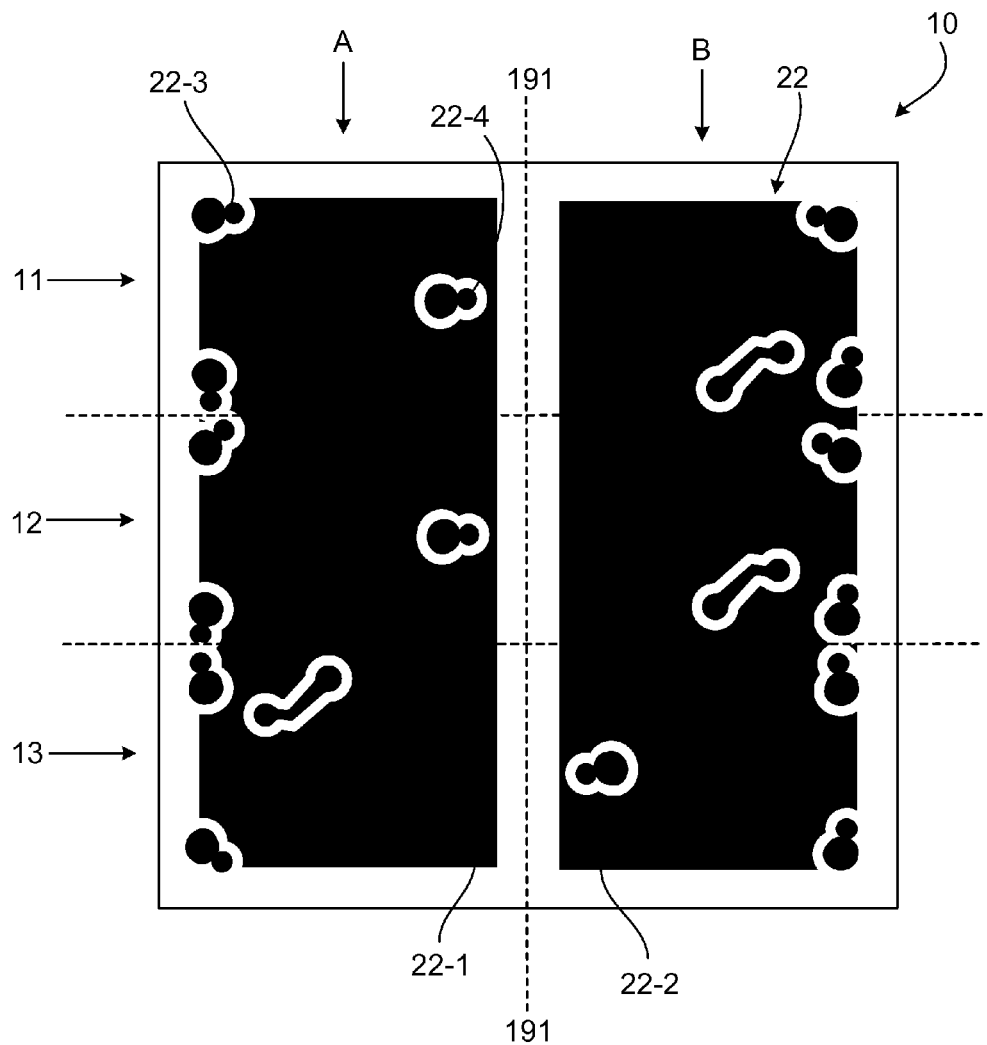
FIG. 3 is a plan view showing an upper inner conductive shield layer of a multichannel isolator.

Referring to FIGS. 3, 6, and 8, the upper and lower shield layers 22 and 25 may be divided into A-side and B-side sections along the isolation boundary 191. The top shield includes upper A-side segment 22-1 and upper B-side segment 22-2 and the bottom shield includes lower A-side segment 25-1 and lower B-side segment 25-2. The A-side and B-side segments of each shield, which are electrically insulated from each other, are separated by a predetermined conductor-free distance along the isolation boundary 191, separating the input circuitry from the output circuitry and generally bisecting the transformer windings. The upper and lower A-side segments (22-1, 25-1) and B-side segments (22-2, 25-2) may be connected to a common or reference terminal for the A-side circuitry, e.g. 44 (FIG. 7) and B-side circuitry, e.g. 48 (FIG. 7), respectively. The division and electrical insulation of the shield sections between input side and output side sections may improve the breakdown isolation rating from input to output of the isolator 10.

Although the A-side (22-1, 25-1) and B-side (22-2, 25-2) shields are shown as common to all three channels, it should be understood that the shields may be further divided such that each channel has its own shield which is isolated from the shields of the other channels.

Connection Terminals

The isolator 10 as shown is configured for surface mount soldering to an external PCB. In the plan view of FIG. 7, a set of pads 41 through 48 are shown formed in the bottom most conductive layer 26 of the substrate 20 which is exposed on the bottom surface of the isolator 10 and ideally suited to form surface mount solder connections between the isolator and a motherboard. The pads 41-48 may be formed as shown in FIGS. 7 and 8 along opposite sides of the isolation boundary 191 near the edges of the substrate 20. The configuration shown in FIG. 7 includes four pads 41-44 on the A-side and four pads 45-48 on the B-side of the isolator 10, sufficient for one input or output signal terminal per isolation channel and one common terminal for each side of the isolation boundary in the three channel example. Referring to FIG. 9, the input terminal 112 of each isolation channel may be used as a common and the output terminal 162 of each isolation channel may be used as a common on its respective side of the isolation boundary. Continuing with the three channel isolator example of FIGS. 1-10, the following pad assignments may be used: pad 44 for the A-side common terminal (connected to input terminals 112 of channels 11 and 12 and output terminal 162 of channel 13); pad 41 for channel 11 input terminal 111, pad 42 for channel 12 input terminal 111, pad 43 for channel 13 output terminal 161; pad 48 for the B-side common terminal (connected to output terminals 162 of channels 11 and 12 and input terminal 112 of channel 13); pad 45 for channel 11 output terminal 161, pad 46 for channel 12 output terminal 161, pad 47 for channel 13 input terminal 111.

Alternate terminal arrangements may also be provided, e.g. each isolator channel may be provided with a dedicated pair of input and or output terminals in which case it may also be desirable to divide the A-side and B-side shields into separate shields for each channel. The termination pads may further include plating or conductive terminals such as pins for through hole or connector mounting or leads such as those described in Vinciarelli et al., Surface Mounting A Power Converter, U.S. Pat. No. 6,940,013, issued Sep. 6, 2005 (the "J-Lead Patent") (assigned to VLT, Inc. of Sunnyvale, Calif., the entire disclosure of which is incorporated herein by reference) for surface mounting.

Electronic Components

As shown in FIG. 2, the top conductive layer 21 may be used to form conductive traces for electrical interconnections and conductive pads to which the electrical components of the interface circuitry may be electrically connected, preferably by surface mount soldering. The circuits of all three isolator channels 11, 12, 13 in the three channel isolator 10 (FIGS. 2-8) are the same and are described by the schematic of FIG. 9. Accordingly, the electrical components of channel 11, which will serve as the exemplary channel for this discussion, are labeled in FIGS. 2 and 8 using the same reference designations as are used in the schematic of FIG. 10. Since all three isolator channels are the same and use the same PCB layout, the following description will be limited to channel 11, with the understanding that the description may also be applied to the other two channels 12 and 13. Outlines of the electrical components are shown in FIG. 2 connected to the conductive pads to which they are connected.

As is well known in the PCB art, connections between the layers may be made with conductive vias that pass vertically through some or all of the layers with or without making electrical connections to a layer through which they are passed. For example, pads 22-3 and 22-4 as shown in FIG. 3 are electrically isolated from the A-side upper shield 22-1 are available for making connections to other conductive layers without connecting to the shield 22-1 through which they pass, which in this case are aligned with pads 23-5 (FIG. 4) at the ends of primary winding 23-1, allowing the primary connections to pass through layer 22 without connecting to either shield. A similar feature, pad 23-6 is shown in FIG. 4 for facilitating a connection through layer 23 without making any connection to the windings formed in that layer. In this manner, the circuits of each channel are connected using conductive traces and conductive vias to complete the circuit shown in the schematic of FIG. 10.

As described above, the three channels share a common terminal on each side of the isolation barrier and similarly share A-side and B-side shields for their respective transformer windings. Thus, the A-side shields 22-1 (FIG. 3) and 25-1 (FIG. 6) are electrically connected to each other and the A-side common terminal 44 (FIG. 7) and the B-side shields 22-2 (FIG. 3) and 25-2 (FIG. 6) are electrically connected to each other and to the B-side common terminal 48 (FIG. 7).

System in a Package Encapsulation

A side view of the isolator 10 in the region of channel 11 is shown in FIG. 8 with the components of channel 11 shown and the components of channels 12 and 13 hidden for clarity. The side view of FIG. 8 includes a cross-section of the substrate 20 showing the six conductive layers 21-26 of the substrate 20 as described above. Layer 21 is shown on the top surface of the substrate 20 below the surface mounted electrical components. Layer 26 is shown on the bottom surface of the substrate 20 as terminations 41 and 45 in FIG. 8. Layers 22 and 25 are shown divided into the respective shields and layers 23 and 24 are shown set in from the edges of the substrate 20 in FIG. 8. The separation of the A-side and B-side shields (A-side: 23-1, 25-1; B-side: 23-2, 25-2), electrical components (A-side: 115, 117, 118, 119, 120; B-side: 165, 166, 167, 168, 170), and terminals A-side: 41; B-side: 45) along isolation boundary 191 and windings (A-side: 23-1; B-side: 24-1) along isolation boundary 192 are illustrated in FIG. 8. An outline of the cured encapsulation material 50 of the preferred system in a package is also shown in FIG. 8 encapsulating the electrical components and the top of substrate 20. The encapsulation may provide better breakdown ratings for the isolator in small packages. The electrical components may preferably occupy the region above the transformer windings, e.g. windings 23-1 and 24-1 of isolator channel 11, and the shields, 22-1, 22-2 and 25-1 and 25-2, are situated below the electrical components of isolator channel 11 as shown in FIG. 8.

Circuit Operation

Referring to FIG. 10, the input side interface circuitry 110 of the first isolator channel (11 in FIGS. 2-6; 100 in FIG. 10) may comprise resistors 116 and 117; capacitors 115 and 120; Schmitt trigger inverter 118 (which may be, e.g., a 74AUP1G14 Schmitt trigger Inverter manufactured by NXP Semiconductor, Eindhoven, The Netherlands, and described in a datasheet entitled 74AUP1G14 Low-power Schmitt trigger inverter Product data sheet, Rev. 5-28 Nov. 2011); and diode 119 (which may be, e.g., a 1PS10SB82 Schottky barrier diode manufactured by NXP Semiconductor, Eindhoven, The Netherlands, and described in a datasheet entitled 1PS10SB82 Schottky barrier diode Product data sheet, 2003 Aug. 20). The input side interface circuitry receives an input signal via terminals 111 and 112 and drives the primary winding (193 in FIG. 10; 23-1 in FIG. 4) via output terminals 113 and 114.

The output side circuitry 160 has input terminals 163 and 164 connected to the secondary winding (24-1 in FIG. 5; 194 in FIG. 10) and includes diode 166 (which may be, e.g., a 1PS10SB82 Schottky barrier diode, referenced above); capacitors 165 and 168; resistors 167, 169, 173; and dual transistor 170, comprising two NPN transistors 171 and 172 (which may be, e.g., a PMBT3904VS dual switching transistor manufactured by NXP Semiconductor, Eindhoven, The Netherlands, and described in a datasheet entitled PMBT3904VS, 40V, 200 mA NPN/NPN switching transistor Product data sheet, Rev. 01-8 Jul. 2009). The output side circuitry delivers an output signal via the output terminals 161 and 162.

The input-side interface circuit 110 may receive an input signal 101, which as shown in FIG. 9 may be a voltage signal. For simplicity, an isolator adapted for digital signals will be described, in which case the input signal Vin(t) 101 will be considered a binary voltage in which a logic one may be represented by a voltage greater than a predetermined minimum high-input voltage, e.g. 2.2 V, and a zero may be represented by a voltage less than a predetermined maximum low-input voltage, e.g. 1.2 V.

Figure 11:
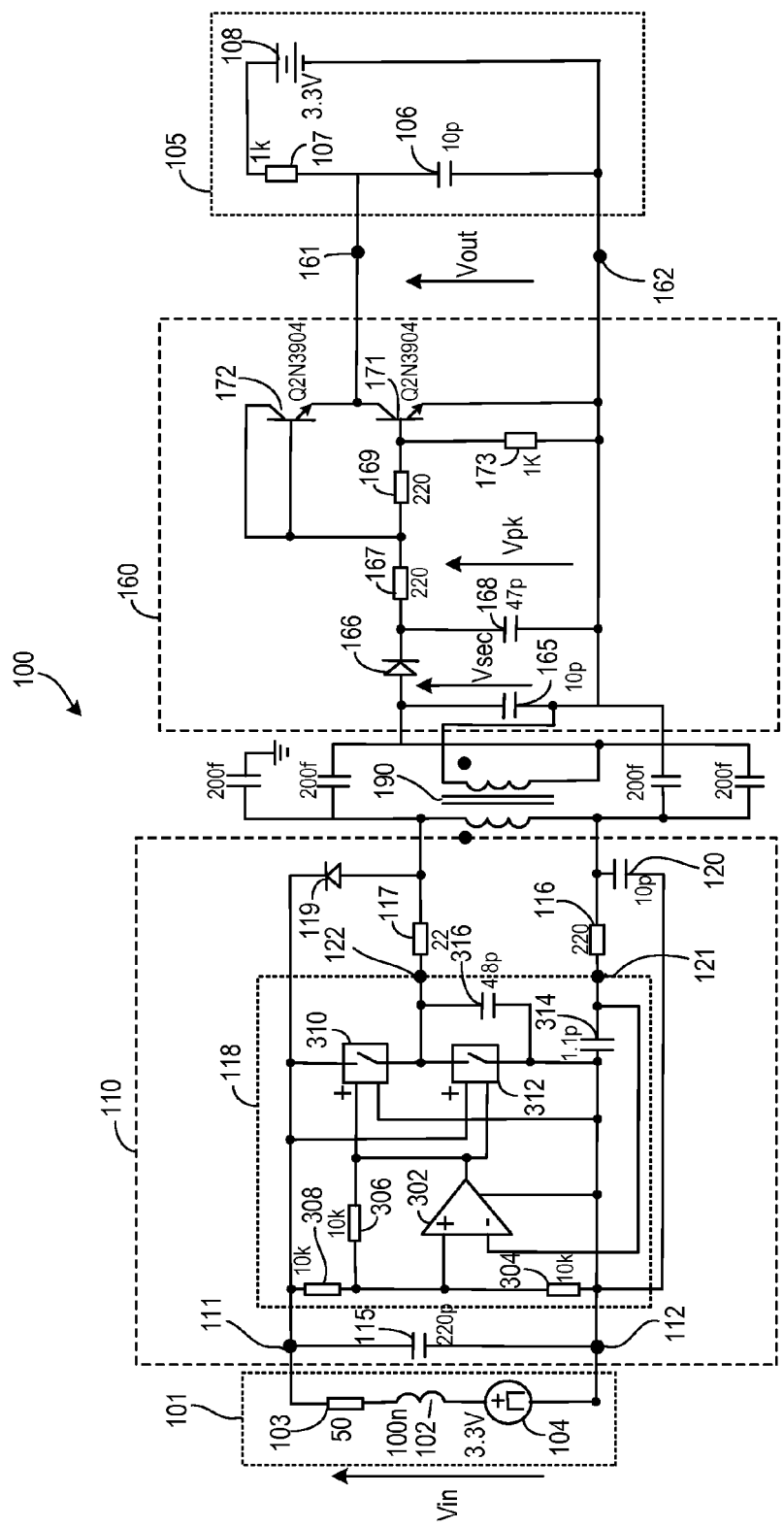
FIG. 11 is a schematic of a behavioral model of the circuit of FIG. 10.

Referring to FIG. 11, a behavioral model of the single channel isolator circuit of FIG. 10 is provided with component values and using component reference designations corresponding to the counterpart components shown in FIG. 10. The input signal has been modeled as a 3.3 Volt pulsed voltage source 104 having a 100 nH series inductance 102 and 50 Ohm series resistance 103. The load circuit 105 for the isolator 100 has been modeled with a 3.3 Volt load bias 108, a 1K pull-up resistor 107 and a 10 pF load capacitance 106.

A behavioral model of the Schmitt trigger inverter 118 in FIG. 10 is shown as the circuitry contained within the dashed area 118 in FIG. 11. The inverter behavioral model 118 accepts an input at node 121 and generates an output at node 122, corresponding to the same nodes in FIG. 10. The model 118 includes high speed comparator 302 (e.g., having a characteristic response time of 5 nS); resistors 304, 306, and 308; parasitic input capacitance 314; parasitic output capacitance 316; and voltage-controlled switches 310 and 312. The voltage controlled switches 310, 312 are configured so that switch 310 is ON and switch 312 is OFF when the output of the comparator 302 is high and switch 310 is OFF and switch 312 is ON when the output of the comparator 302 is low. Resistors 308, 306 and 304 set the hysteresis and input thresholds for the comparator 302: with a voltage Vin across input terminals 111, 112, and with the resistor values shown in FIG. 11, the upper threshold for the comparator is set to $2/3*Vin$ and the lower threshold is set to $1/3*Vin$. Thus, if the comparator input 121 is below $1/3*Vin$, the output 122 will remain high until the comparator input 121 goes above $2/3*VIN$ at which time the output 122 will go low. Similarly, if the comparator input 121 is above $2/3*Vin$, the output 122 will remain low until the comparator input 121 goes below $1/3*VIN$ at which time output 122 will go high.

Power for the input side circuitry is provided exclusively by the data input signal Vin at terminals 111, 112. When the data input signal goes high (e.g., Vin=3.3V), the input side interface circuit 110 will power-up and oscillate at a resonant frequency that is primarily determined by the inductances of transformer 190 and the values of primary side capacitor 120 and secondary side capacitor 165. The relative degree to which capacitors 120 and 165 affect the resonant frequency is a function of the coupling coefficient, k, of transformer 190: for relatively low coupling coefficients (e.g., k=0.5) the equivalent resonant capacitance may be dominated by primary side capacitor 120; for relatively higher values of k (e.g., close to 1) the equivalent resonant capacitance may approach the sum of the values of capacitor 120 and the reflected value of secondary side capacitor 165.

The oscillating voltage, Vsec, across capacitor 165 is rectified by diode 166 and smoothed by capacitor 168. The voltage, Vpeak, across capacitor 168 turns ON transistor 171. Transistor 172 is arranged to act as a Baker clamp to prevent transistor 171 from saturating. This ensures rapid turning OFF of transistor 171 when the data input signal goes low and oscillation ceases. The detector circuit 160, which is powered exclusively by energy transferred from the input circuit 110 via the transformer 190, provides an open-collector output for sinking an output current (analogous to that of an opto-coupler). The open-collector output when activated sinks a current from the output voltage Vout. The load pull-up voltage (source 108 in FIG. 11) should not be confused with a source of bias or operating power for the detector circuit 160 which operates exclusively from power provided by the input signal (pulsed source 104) via transformer 190.

Figure 12:
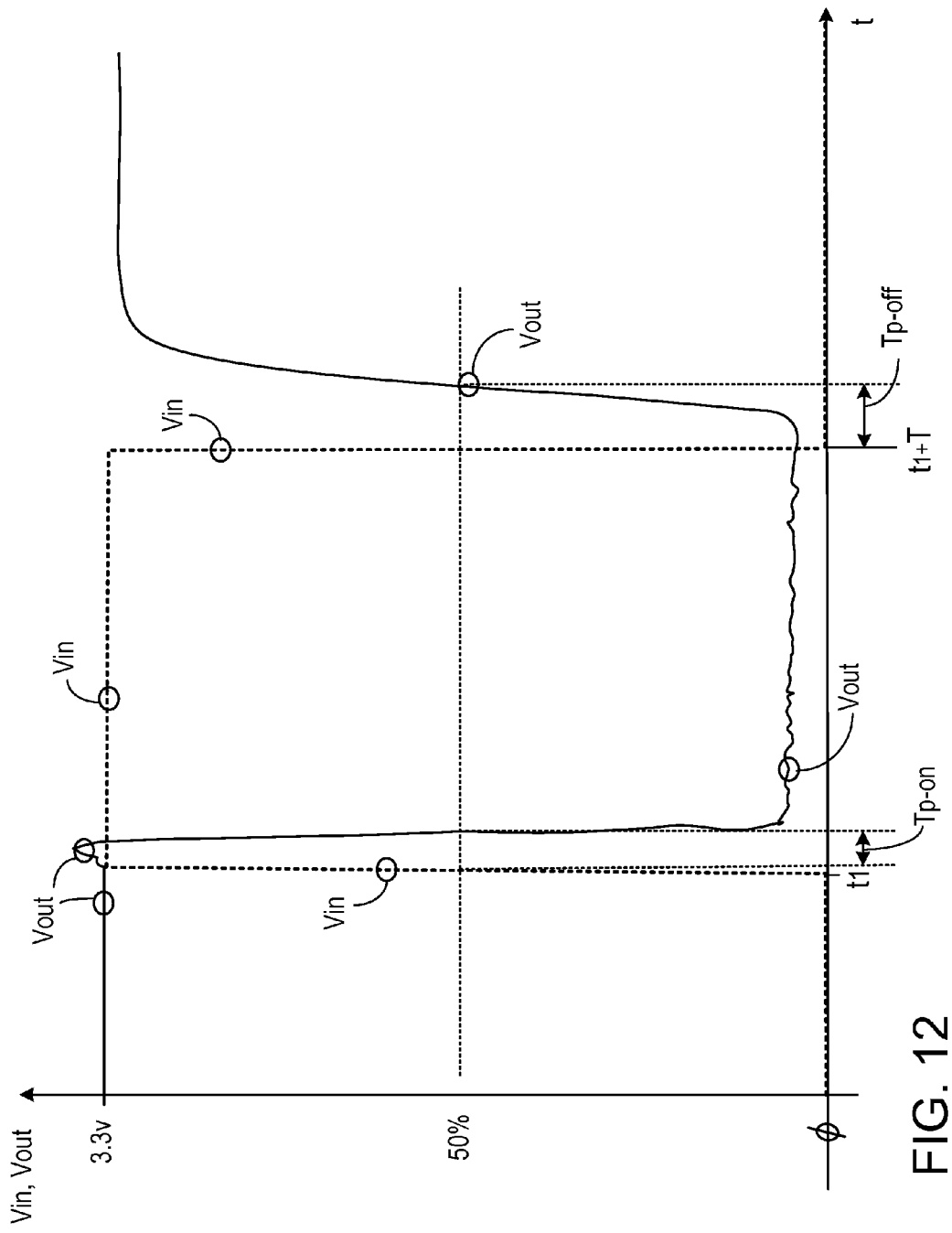
FIGS. 12 and 13 show waveforms for the circuit of FIG. 11.
Figure 13:
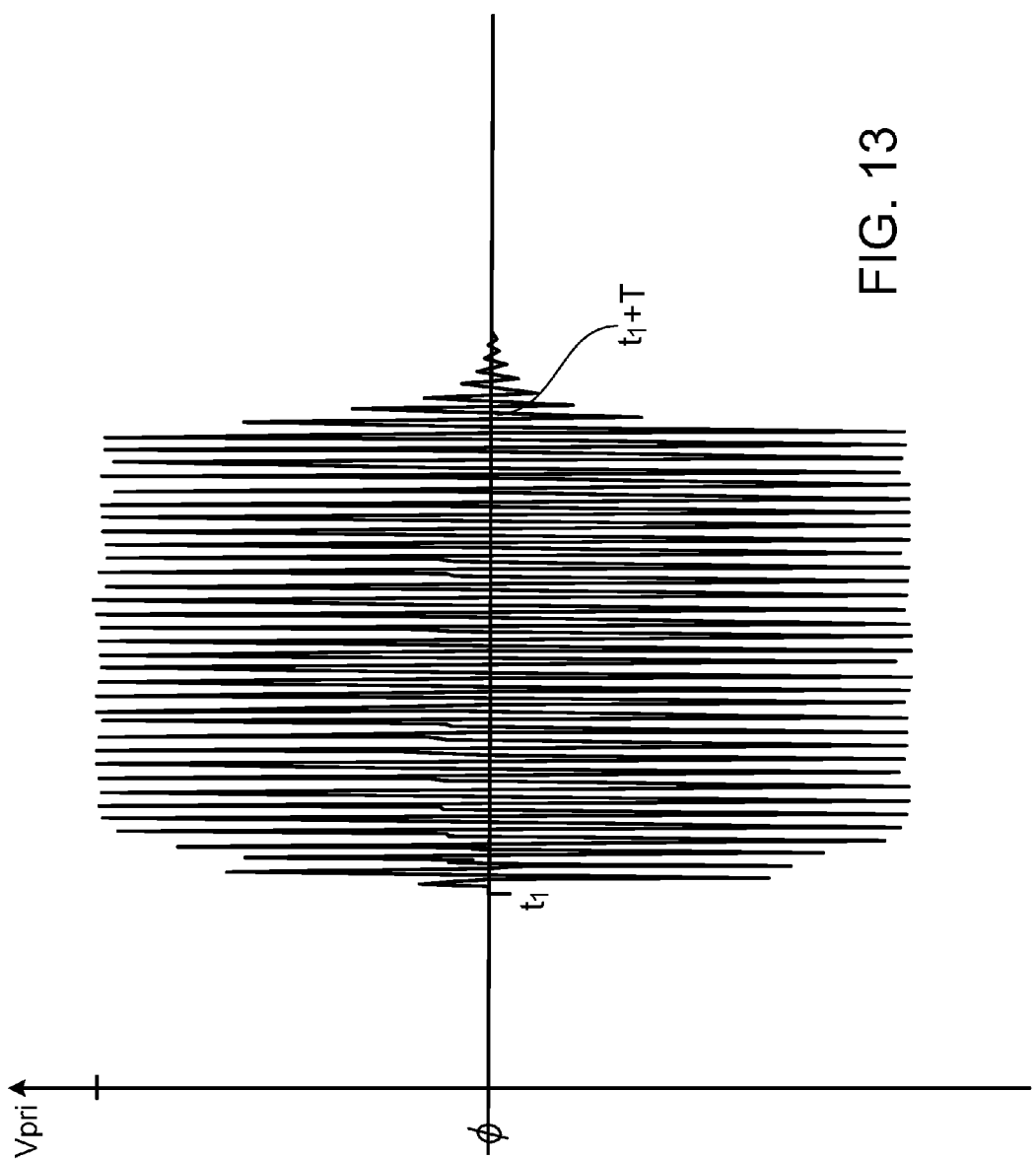

FIGS. 12 and 13 show simulated operating waveforms for the behavioral circuit of FIG. 11 with the component values shown; with a transformer 190 characterized by a 1:1 turns ratio, a primary inductance of 220 nH, and a coupling coefficient k=0.54; with the data input signal, Vin, comprising a series of 500 nanosecond pulses and using the load circuit 105 as shown in FIG. 11. The resonant frequency of oscillation of the isolator 100 is approximately 72 MHz. FIG. 12 shows a single input pulse beginning at time t1 and ending at time t1+T, where T is the pulse width of 500 nanoseconds and the isolator output voltage, Vout. As shown in FIG. 12, the output signal is a faithful reproduction of the input signal with a propagation delay from input to output for turn ON, Tp-on, approximately 45 nS and for turn OFF, Tp-off, approximately 77 nS (measured at the 50% point). FIG. 13 shows the approximately 72 Mhz oscillating waveform across the primary winding 193 during the 500 nS input pulse.

In resonant embodiments that comprise multiple isolator circuits, such as the embodiment of FIGS. 2 through 9, it may be desirable to operate each isolator circuit at a different frequency of oscillation as this may reduce crosstalk between circuits, e.g. channels 11, 12, and 13 may be operated at approximately 50, 75, and 100 MHz.

Digital Primary Implementation

Figure 14:
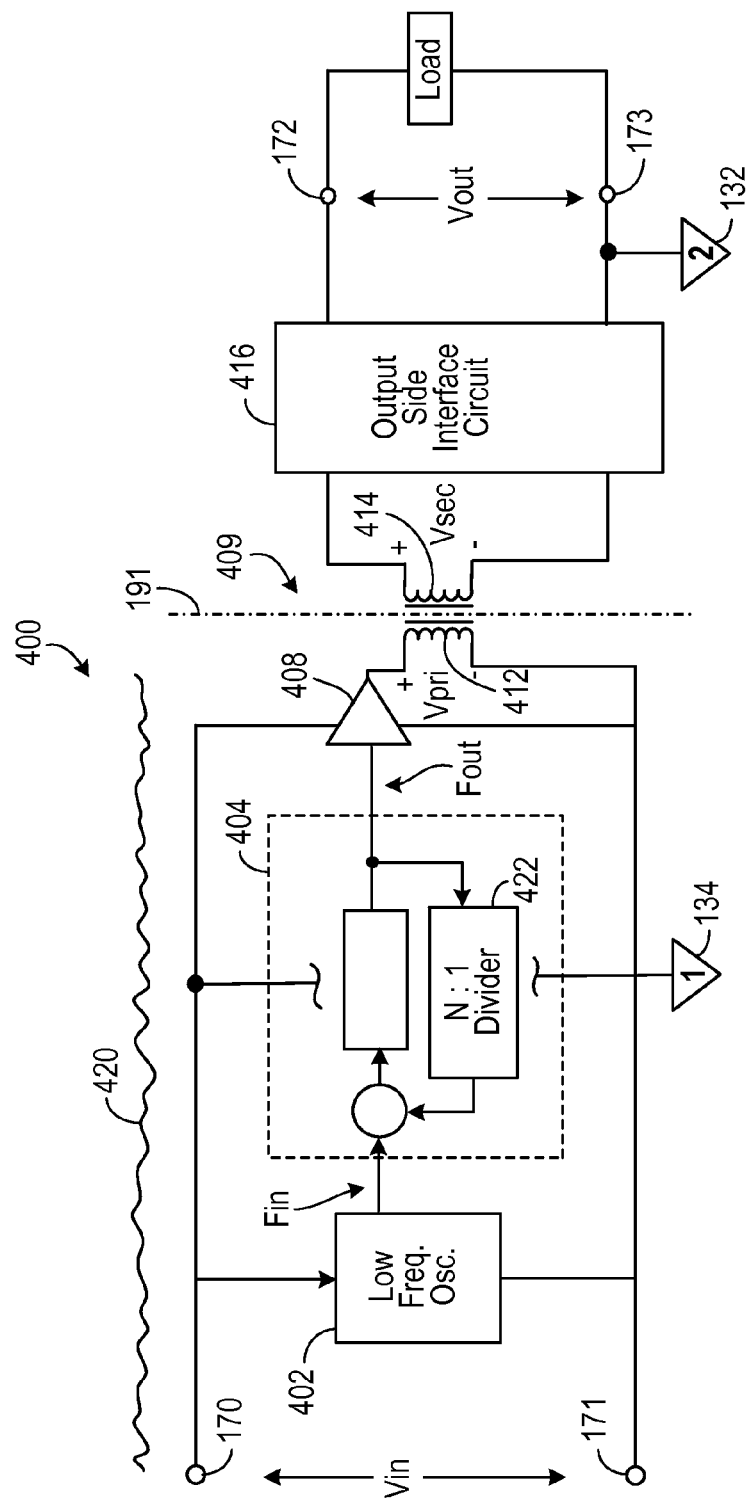
FIG. 14 shows a block diagram of another embodiment of single isolator channel.

The example shown in FIGS. 10 and 11 uses an analog oscillator circuit, which includes the transformer in the oscillator loop, to drive the primary winding. Another example of a single isolator channel 400 is shown in FIG. 14 using digital interface circuitry 420 to drive the primary winding of the transformer. The digital implementation as shown may include a low frequency oscillator 402 that delivers a relatively low frequency output signal, Fin, e.g. 2.5 MHz, to a frequency multiplier 404 that delivers a high frequency output, Fout=N*Fin, e.g. N=100, Fout=250 MHz. A buffer 408 may be used to drive the primary winding 412 of transformer 409 with the high frequency signal, Fout. As shown in FIG. 14, the frequency multiplier may include a digital phase-locked loop which may for example use a digital N:1 divider 422 in the feedback path. As shown, the oscillator 402 operates without closing a loop on the transformer resonant circuit; however, the transformer may be tuned to the approximate high frequency signal, Fout.

In operation, the digital implementation of the primary-side interface circuitry performs the same basic function as in the previous example: for input signals, Vin, greater than the predetermined threshold, power derived from the input signal is supplied to the input interface circuitry 420 which in turn drives the primary winding of the transformer with the high frequency signal, Fout. The output side interface circuitry 416 (which may, e.g., be substantially the same as output side circuitry 160 shown in FIG. 10) receives the high frequency signal from secondary winding 414 and drives the output, Vout, low whenever the presence of the high frequency signal is detected.

Analog Isolator

Figure 15:
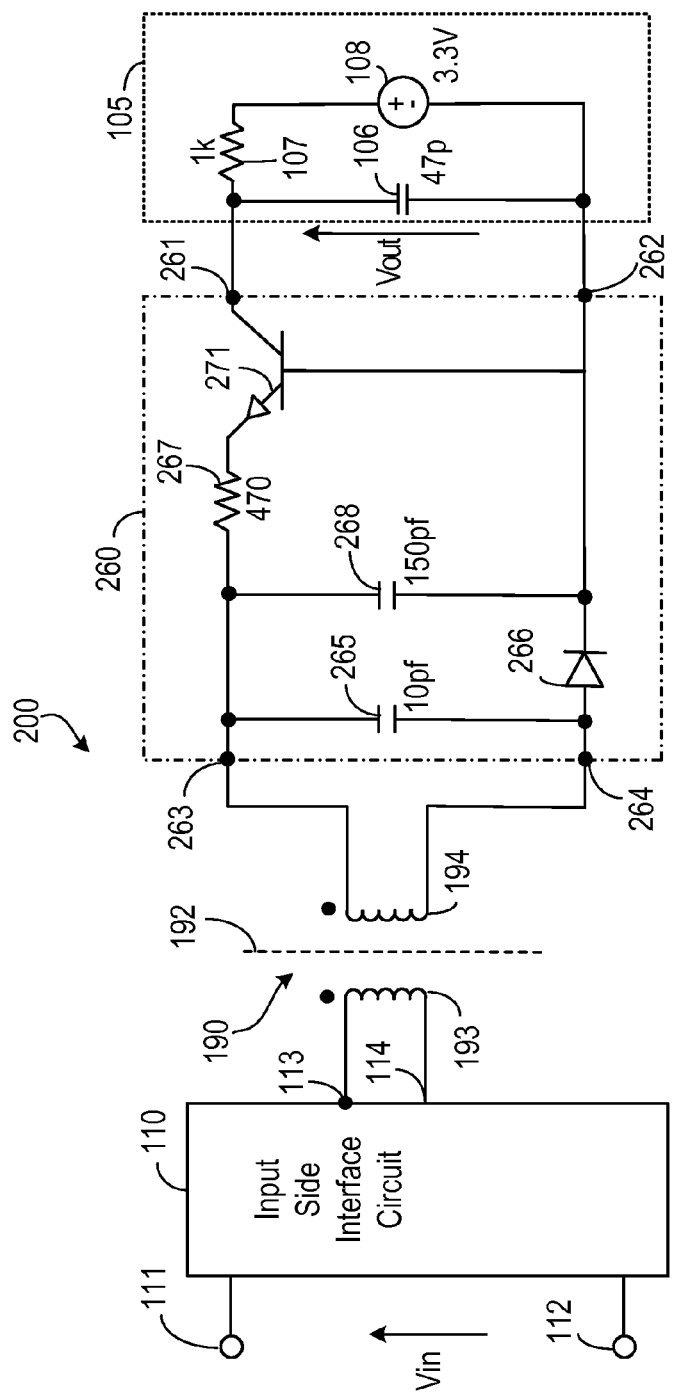
FIG. 15 shows a block diagram of a single isolator channel with proportional output circuitry.

The previous examples of FIGS. 10, 11, and 14 were discussed in the context of transmitting a binary signal across the isolation boundary; however, the isolator may be modified to provide transmission of an analog or proportional signal across the isolation boundary. Referring to FIG. 15, a modified single channel isolator 200 is shown including a primary-side interface circuit 110 (which may be the same as the previously discussed primary-side interface circuits 110, FIG. 10; 420, FIG. 14), and a modified secondary-side interface circuit 260 capable of providing an output signal that is proportional to the input signal over a predetermined range. The secondary winding 194 is connected to the input 263, 264 of the secondary-side interface circuit 260. Capacitor 265, like capacitor 165 may be used to influence the resonance of the transformer circuit. Diode 266 and capacitor 268 provide peak detection of the secondary voltage. A common-base transistor amplifier 271 decouples the output 261, 262 from the peak detection circuit and sinks a current proportional to the magnitude of the secondary voltage over a predetermined voltage range. The output circuit model 105 includes a slightly larger (47 pF) capacitor 106 for the proportional application as compared to the 10 pF value in the example of FIG. 11.

The input-side interface circuit 110 shown in FIGS. 10 and 11 performs well as a proportional transmitter when used in conjunction with the modified output-side interface circuit 260 in FIG. 15. Above a minimum input voltage of approximately 1.6 V, required to start the oscillator and provide power to the output-side interface circuit 260, the input-side interface circuit 110 will drive the primary winding 193 in proportion to the input voltage thus amplitude modulating the secondary voltage. The out-side interface circuit 260 is adapted to sink an output current that is in proportion to the amplitude of the secondary voltage over a predetermined operating range.

Figure 16:
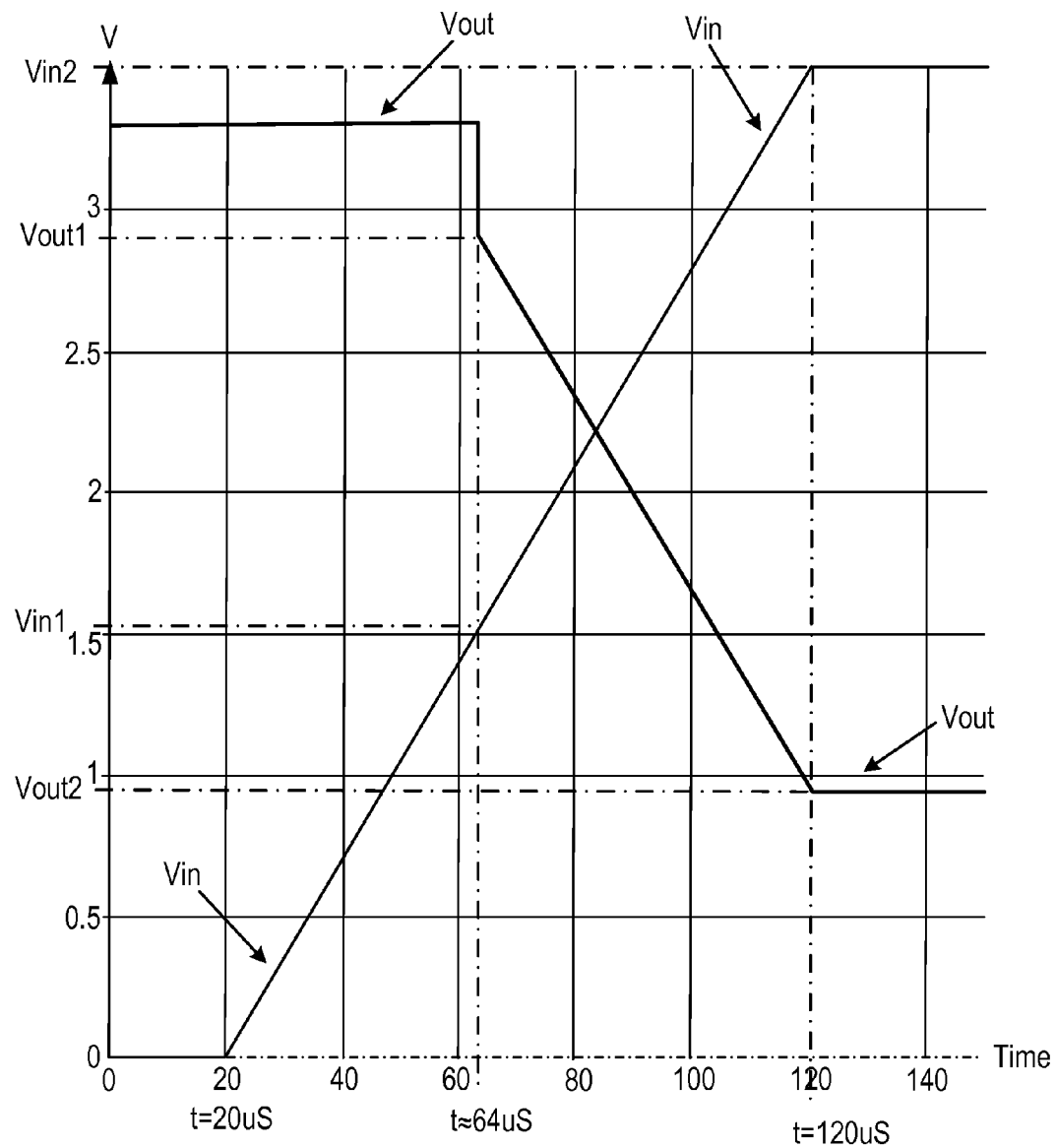
FIG. 16 shows waveforms for the circuit of FIG. 15.

Referring to FIG. 16, a simulation plot of the input and output voltages versus time for the isolator 200 (using the primary-side interface circuit 110 of FIGS. 10 and 11 and the output-side interface circuit 260 of FIG. 15) are shown. For the simulation plot of FIG. 16, the pulse function voltage source 104 shown in FIG. 11 has been modified to ramp linearly from 0 volts at time t=20 uS to approximately 3.5 V at 120 uS. As shown in FIG. 16, as the input voltage approaches a minimum operating input voltage, Vin1 (Vin≈1.6V, t≈64 uS), the output voltage drops from 3.3V to Vout1 (Vout≈2.9V). Thereafter, the output voltage decreases linearly from Vout1 (≈2.9V) to the minimum, Vout2 (Vout≈0.9V, t≈120 uS), in proportion to linear increases in the input voltage from the minimum Vin1 (Vin≈1.6V, t≈64 uS) to a maximum Vin 2 (Vin≈3.5V, t≈120 uS). As shown by the simulation plots, the isolator 200 can function as an analog isolation channel in the range from Vin1 to Vin2.

Other embodiments are within the scope of the following claims. For example, the substrate may be embodied as a multilayer fiberglass printed circuit board, as a multilayer ceramic substrate, or some combination thereof. The isolator components may be protected by over-molding, e.g. with epoxy, thermoplastic, or other suitable materials, and preferably as a system in a package. Alternatively the isolator may be housed in an enclosure.

What is claimed is:

1. An apparatus comprising:
   a substrate for supporting circuitry and having a plurality of parallel conductive layers separated by insulation;
   a region formed in the substrate having an upper conductive shield formed in a second conductive layer of the substrate and a lower conductive shield formed in a fifth conductive layer of the substrate,
   a transformer formed in the region between the upper conductive shield and lower conductive shield and including a primary winding formed in a third conductive layer of the substrate and a secondary winding formed in a fourth conductive layer of the substrate;
   the region providing space for a magnetic field coupling the windings;
   a first high frequency oscillator circuit having an input for receiving an input signal, the first oscillator circuit being connected to excite the primary winding at a first frequency in response to the input signal;
   a first detector circuit coupled to the secondary winding, having a first output, being adapted to selectively sense the first frequency, and being configured to provide an output signal via the first output in response to the first oscillator exciting the primary winding; and encapsulation material covering the electronic components and at least a portion of an upper surface of the substrate.

2. The apparatus of claim 1 wherein the oscillator circuit is powered exclusively by power received from the input signal.

3. The apparatus of claim 1 wherein the detector circuit is powered exclusively by power received through the transformer.

4. The apparatus of claim 1 wherein the detector circuit is powered exclusively by power received from the oscillator circuit through the transformer and the oscillator circuit is powered exclusively by power received from the input signal.

5. The apparatus of claim 4 wherein the oscillator circuit is adapted to amplitude modulate the excitation of the primary winding as a function of the input signal.

6. The apparatus of claim 5 wherein the first detector circuit is adapted to provide an analog output signal having an amplitude that is a function of the amplitude of the excitation.

7. The apparatus of claim 6 wherein the first detector includes an open-collector output.

8. The apparatus of claim 6 wherein the first detector circuit sinks a current as the output signal.

9. The apparatus of claim 4 wherein the first detector circuit is adapted to provide a binary output signal having a state that is a function of the presence or absence of the excitation.

10. The apparatus of claim 9 wherein the first detector includes an open-collector output.

11. The apparatus of claim 10 wherein the first detector circuit sinks a current as the output signal.

12. The apparatus of claim 1 wherein the region occupies an area in the substrate that is below electronic components on the upper surface of the substrate.

13. The apparatus of claim 1 wherein the region is free of magnetically permeable material.

14. The apparatus of claim 1 wherein the substrate comprises the following conductive layers separated by insulation:
(1) a first conductive layer on the upper surface of the substrate for forming connections between electronic components on the surface of the substrate;
(2) the second conductive layer being below the first conductive layer;
(3) the third conductive layer being below the second conductive layer;
(4) the fourth conductive layer being below the third conductive layer; and
(5) the fifth conductive layer being below the fourth conductive layer.

15. The apparatus of claim 14 wherein the substrate further comprises: (6) a sixth conductive layer on a bottom surface of the substrate, separated from the fifth conductive layer by insulation, for forming connections between the substrate and an external circuit.

16. The apparatus of claim 1 wherein the first frequency of the oscillator circuit is tightly controlled.

17. The apparatus of claim 16 wherein the oscillator circuit comprises a resonant tank including the transformer.

18. The apparatus of claim 16 wherein the oscillator circuit comprises a digital oscillator and frequency multiplier.

19. The apparatus of claim 1 wherein the transformer is loosely coupled.

20. The apparatus of claim 19 wherein the transformer is characterized by a coupling coefficient between the windings that is less than 60%.

21. The apparatus of claim 19 wherein the transformer is characterized by a coupling coefficient between the windings that is less than 35%.

22. The apparatus of claim 1 further comprising:
a second region formed in the substrate;
a second transformer formed in the second region including a second primary winding formed in a selected conductive layer of the substrate and a second secondary winding formed in another selected conductive layer of the substrate;
a second high frequency oscillator circuit having a second input for receiving a second input signal, the second oscillator circuit being connected to excite the second primary winding at a second frequency in response to the second input signal, wherein the second frequency and the first frequency are separated by a predetermined difference in frequency; and
a second detector circuit having a second output, being adapted to selectively sense the second frequency, being coupled to the second secondary winding, and being configured to provide a second output signal via the second output in response to the second oscillator exciting the second primary winding.

23. The apparatus of claim 22 wherein the oscillator circuit is powered exclusively by power received from the input signal.

24. The apparatus of claim 23 wherein the detector circuit is powered exclusively by power received through the transformer.

25. A method of providing galvanic isolation for one or more signals comprising:
providing a substrate for supporting isolator circuitry and having a plurality of parallel conductive layers separated by insulation;
providing a region in the substrate between an upper conductive shield formed in a second conductive layer of the substrate and a lower conductive shield formed in a fifth conductive layer of the substrate,
forming a first transformer in the region between the upper conductive shield and lower conductive shield including a first primary winding formed in a third conductive layer of the substrate and a first secondary winding formed in a fourth conductive layer of the substrate;
providing space in the region for a magnetic field coupling the first primary and secondary windings;
exciting the primary winding at a first frequency using power derived exclusively from a first input signal;
selectively sensing the first frequency at the secondary winding;
providing an output signal via a first output in response to sensing the first frequency using power derived from the secondary winding; and
providing encapsulation material covering the electronic components and at least a portion of the upper surface of the substrate.

26. The method of claim 25, comprising amplitude modulating the excitation of the primary winding as a function of the input signal.

27. The method of claim 26, comprising providing an analog output signal having an amplitude that is a function of the amplitude of the excitation.

28. The method of claim 25, comprising providing a binary output signal having a state that is a function of the presence or absence of the excitation.

29. The method of claim 25 wherein providing a region comprises providing a region that occupies an area in the substrate that is below electronic components on the upper surface of the substrate.

30. The method of claim 25 wherein providing a region comprises providing a region that is free of magnetically permeable material.

31. The method of claim 25 wherein providing the substrate comprises providing the following conductive layers separated by insulation:
   (1) a first conductive layer on an upper surface of the substrate for forming connections between electronic components on the surface of the substrate;
   (2) the second conductive layer being below the first conductive layer;
   (3) the third conductive layer being below the second conductive layer;
   (4) the fourth conductive layer being below the third conductive layer; and
   (5) the fifth conductive layer being below the fourth conductive layer.

32. The method of claim 31 wherein providing the substrate further comprises providing: (6) a sixth conductive layer on a bottom surface of the substrate, separated from the fifth conductive layer by insulation, for forming connections between the substrate and an external circuit.

33. The method of claim 25, comprising tightly controlling the first frequency of the oscillator circuit.

34. The method of claim 25 wherein forming a transformer comprises forming a transformer that is loosely coupled.

35. The method of claim 34 wherein forming a transforming comprises forming a transformer that is characterized by a coupling coefficient between the windings that is less than 60%.

36. The method of claim 34 wherein forming a transforming comprises forming a transformer that is characterized by a coupling coefficient between the windings that is less than 35%.

37. The method of claim 25 further comprising:
forming a second region in the substrate;
forming a second transformer in the second region including a second primary winding formed in a selected conductive layer of the substrate and a second secondary winding formed in another selected conductive layer of the substrate;
exciting the second primary winding at a second frequency in response to a second input signal, wherein the second frequency and the first frequency are separated by a predetermined difference in frequency;
sensing the second frequency at the second primary winding; and
providing a second output signal via the second output in response to sensing the second frequency.

38. An apparatus comprising:
a substrate having a plurality of parallel conductive layers separated by insulation;
a region formed in the substrate having an upper conductive shield formed in a second conductive layer of the substrate and a lower conductive shield formed in a fifth conductive layer of the substrate,
a transformer formed in the region between the upper conductive shield and lower conductive shield and including a primary winding formed in a third conductive layer of the substrate and a secondary winding formed in a fourth conductive layer of the substrate;
the region providing space for a magnetic field coupling the windings;
a first high frequency oscillator circuit having an input for receiving an input signal, the first oscillator circuit being connected at one end of the substrate to excite the primary winding at a first frequency in response to the input signal;
a first detector circuit connected at an opposite second end of the substrate to the secondary winding, having a first output, being adapted to selectively sense the first frequency, and being configured to provide an output signal via the first output in response to the first oscillator exciting the primary winding.

* * * * *

UNITED STATES PATENT AND TRADEMARK OFFICE
CERTIFICATE OF CORRECTION

| | | |
|---|---|---|
| PATENT NO. | : 8,772,909 B1 | Page 1 of 1 |
| APPLICATION NO. | : 13/645133 | |
| DATED | : July 8, 2014 | |
| INVENTOR(S) | : Patrizio Vinciarelli | |

It is certified that error appears in the above-identified patent and that said Letters Patent is hereby corrected as shown below:

IN THE SPECIFICATION:

Column 8, line 14 (Approx.), delete "and or" and insert -- and/or --

Signed and Sealed this
Twentieth Day of January, 2015

Michelle K. Lee
*Deputy Director of the United States Patent and Trademark Office*